US008558315B2

(12) United States Patent
Chen et al.

(10) Patent No.: US 8,558,315 B2
(45) Date of Patent: Oct. 15, 2013

(54) TRENCH ISOLATION MOS P-N JUNCTION DIODE DEVICE AND METHOD FOR MANUFACTURING THE SAME

(75) Inventors: Mei-Ling Chen, New Taipei (TW); Hung-Hsin Kuo, New Taipei (TW); Kou-Liang Chao, New Taipei (TW)

(73) Assignee: PFC Device Corporation, New Taipei (TW)

( * ) Notice: Subject to any disclaimer, the term of this patent is extended or adjusted under 35 U.S.C. 154(b) by 98 days.

(21) Appl. No.: 13/190,918

(22) Filed: Jul. 26, 2011

(65) Prior Publication Data

US 2012/0049287 A1 Mar. 1, 2012

(30) Foreign Application Priority Data

Sep. 1, 2010 (TW) ................................ 99129562 A

(51) Int. Cl.
*H01L 29/66* (2006.01)
(52) U.S. Cl.
USPC ........... 257/368; 257/329; 257/331; 257/487; 257/488; 257/489; 257/490; 257/494; 257/495; 257/330
(58) Field of Classification Search
USPC .................................. 257/288, 368, 487–490
See application file for complete search history.

(56) References Cited

U.S. PATENT DOCUMENTS

| 5,677,231 | A | * | 10/1997 | Maniar et al. | 438/221 |
| 6,043,126 | A | * | 3/2000 | Kinzer | 438/273 |
| 6,452,230 | B1 | * | 9/2002 | Boden, Jr. | 257/341 |
| 6,624,030 | B2 | | 9/2003 | Chang et al. | |
| 7,041,559 | B2 | * | 5/2006 | Baliga | 438/268 |
| 2005/0062124 | A1 | * | 3/2005 | Chiola | 257/476 |
| 2006/0035422 | A1 | * | 2/2006 | He et al. | 438/167 |
| 2007/0034943 | A1 | * | 2/2007 | Kushiyama et al. | 257/330 |
| 2008/0237782 | A1 | * | 10/2008 | Williams et al. | 257/513 |
| 2009/0078992 | A1 | * | 3/2009 | Kaneko | 257/328 |

* cited by examiner

*Primary Examiner* — Steven Loke
*Assistant Examiner* — Junaiden Mirsalahuddin
(74) *Attorney, Agent, or Firm* — WPAT, PC; Justin King

(57) ABSTRACT

A trench isolation metal-oxide-semiconductor (MOS) P-N junction diode device and a manufacturing method thereof are provided. The trench isolation MOS P-N junction diode device is a combination of an N-channel MOS structure and a lateral P-N junction diode, wherein a polysilicon-filled trench oxide layer is buried in the P-type structure to replace the majority of the P-type structure. As a consequence, the trench isolation MOS P-N junction diode device of the present invention has the benefits of the Schottky diode and the P-N junction diode. That is, the trench isolation MOS P-N junction diode device has rapid switching speed, low forward voltage drop, low reverse leakage current and short reverse recovery time.

3 Claims, 16 Drawing Sheets

US 8,558,315 B2

TRENCH ISOLATION MOS P-N JUNCTION DIODE DEVICE AND METHOD FOR MANUFACTURING THE SAME

This application claims the benefit of Taiwan Patent Application No. 99129562, filed Sep. 1, 2010, the subject matter of which is incorporated herein by reference.

FIELD OF THE INVENTION

The present invention relates to a trench isolation metal-oxide-semiconductor (MOS) P-N junction diode device, and more particularly to a trench isolation MOS P-N junction diode device with low leakage current, high reverse voltage, low forward voltage drop and fast reverse recovery time. The present invention also relates to a method for manufacturing such a diode device.

BACKGROUND OF THE INVENTION

A Schottky diode is a unipolar device using electrons as carriers, which is characterized by high switching speed and low forward voltage drop. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. In contrast to the Schottky diode, a P-N junction diode is a bipolar device that can pass more current than the Schottky diode. However, the P-N junction diode has a forward voltage drop higher than that of the Schottky diode, and takes longer reverse recovery time due to a slow and random recombination of electrons and holes during the recovery period.

For combining the benefits of the Schottky diode and the P-N junction diode, a configuration of a gated diode device has been disclosed. In the gated diode, the equi-potential gate and source electrodes of a planar MOSFET are served as the anode, and the drain electrode at the backside of the wafer is served as the cathode. The gated diode device has comparable or lower forward voltage drop with respect to the Schottky diode. The reverse leakage current of the gated diode device is similar to the P-N junction diode, but is lower than the Schottky diode. The reverse recovery time at high temperature of the gated diode device is similar to the Schottky diode. The interface tolerance temperature of the gated diode device is higher than the Schottky diode. In practical applications, the gated diode device is advantageous over the Schottky diode.

A typical gated diode device has been disclosed in U.S. Pat. No. 6,624,030, which is entitled "RECTIFIER DEVICE HAVING A LATERALLY GRADED P-N JUNCTION FOR A CHANNEL REGION". Please refer to FIGS. 1A~1I, which schematically illustrate a method of manufacturing a gated diode device.

Firstly, as shown in FIG. 1A, an N+ substrate 20 with an N− epitaxial layer 22 grown thereon is provided, wherein a field oxide layer 50 is grown on the surface of the N− epitaxial layer 22. Then, as shown in FIG. 1B, a photoresist layer 52 is formed on the field oxide layer 50. A first photolithography and etching process is performed to partially remove the field oxide layer 50. Then, a first ion-implanting process is performed to dope the substrate with a P-type dopant (e.g. boron) through openings in the photoresist layer 52. Then, a boron thermal drive-in process is perform to form edge P-doped structures 28 and a center P-doped structure 30 (FIG. 1C).

Then, a second ion-implanting process is performed to dope the substrate with BF2. Then, a second photolithography and etching process is performed to use a photoresist layer 54 to cover the periphery of the device region and remove the field oxide layer 50 in the center of the device region (FIG. 1D and FIG. 1E). As shown in FIG. 1F, a gate silicon oxide layer 56, a polysilicon layer 58 and a silicon nitride layer 60 are sequentially grown, and an arsenic implantation process is made. Then, as shown in FIG. 1G, an oxide layer 62 is formed by chemical vapor deposition. Then, a third photolithography and etching process is performed to form a gate-pattern photoresist layer 64 over the oxide layer 62. Then, a wet etching process is performed to etch the oxide layer 62 while leaving the oxide layer 62 under the gate-pattern photoresist layer 64 (FIG. 1H). Then, a dry etching process is performed to partially remove the silicon nitride layer 60, and a third ion-implanting process is performed to dope the substrate with boron ion (FIG. 1I). Then, the remaining photoresist layer 64 is removed, and a fourth ion-implanting process is performed to dope the substrate with boron ion to form a P-type pocket 36 (FIG. 1J). Then, a wet etching process is performed to remove the silicon oxide layer 62, and a dry etching process is performed to partially remove the polysilicon layer 58 (FIG. 1K). Then, an arsenic implantation process is made to form an N-doped source/drain region 24, a wet etching process is performed to remove the silicon nitride layer 60, and an arsenic implantation process is made (FIG. 1L). Meanwhile, some fabricating steps of the gated diode device have been done. After subsequent steps (e.g. metallic layer formation, photolithography and etching process, and so on) are carried out, the front-end process is completed.

In comparison with the Schottky diode, the gated diode device fabricated by the above method has comparable forward voltage drop, lower reverse leakage current, higher interface tolerance temperature, better reliability result and longer reverse recovery time (at the room temperature).

SUMMARY OF THE INVENTION

Therefore, the present invention relates to a trench isolation metal-oxide-semiconductor (MOS) P-N junction diode device and a manufacturing method thereof. To simplify the naming for this device, it is also named as Isolated MOS Rectifier (i-MOS Rectifier). The trench isolation MOS P-N junction diode device is a combination of an N-channel MOS structure and a lateral P-N junction diode, wherein a poly-silicon-filled trench oxide layer is buried in the P-type structure to replace the majority of the P-type structure. In a forward mode, the N-channel MOS structure and the P-N junction diode (i-MOS Rectifier) are connected with each other in parallel. Under this circumstance, like the Schottky diode, the trench isolation MOS P-N junction diode device (i-MOS Rectifier) has low forward voltage drop and rapid switching speed. Whereas, in a reverse mode, the leakage current is pinched off and the N-channel is shut off by the poly-silicon—filled trench oxide layer and the depletion region of the lateral P-N junction diode, so that the trench isolation MOS P-N junction diode device (i-MOS Rectifier) has low leakage current. In addition, since the poly-silicon-filled trench oxide layer is buried in the P-type structure to replace the majority of the P-type structure, the area of the P-type structure is reduced and the influence of the carrier effect is reduced. Under this circumstance, the trench isolation MOS P-N junction diode device has shorter reverse recovery time. As a result, the trench isolation MOS P-N junction diode device of the present invention has the benefits of the Schottky diode and the P-N junction diode. That is, the trench isolation MOS P-N junction diode device (i-MOS Rectifier) of the present invention has rapid switching speed, low forward voltage drop, low reverse leakage current and short reverse recovery time.

An embodiment of the present invention provides a trench isolation metal-oxide-semiconductor (MOS) P-N junction diode device. The trench isolation metal-oxide-semiconductor (MOS) P-N junction diode device includes a substrate, a trench structure, a trench oxide layer, a polysilicon layer, a gate oxide layer, a gate structure, a doped region and a metallic sputtering layer. By the trench structure may, the substrate is divided into a first surface portion and a second surface portion. The trench oxide layer is formed on an inner surface of the trench structure. The polysilicon layer is filled in the trench structure and formed on the trench oxide layer, but at a level lower than a surface of the substrate. The gate oxide layer is formed on the first surface portion of the substrate. The gate structure is formed on the gate oxide layer. The doped region is formed under the first surface portion and outside the gate oxide layer. The gate structure, the polysilicon layer in the trench structure and the doped region are covered by the metallic sputtering layer.

Another embodiment of the present invention provides a method for manufacturing a trench isolation metal-oxide-semiconductor (MOS) P-N junction diode device. Firstly, a substrate is provided. A first mask layer is formed on the substrate. A first photolithography and etching process is performed to partially remove the first mask layer to form a sidewall structure on the substrate. A second mask layer is grown on the substrate, the sidewall structure and the first mask layer. A second photolithography and etching process is performed to partially remove the second mask layer to form a gate structure. A third mask layer is formed on the substrate, the first mask layer and the gate structure. A dry etch-back process is performed to partially remove the third mask layer to form a covering structure on a sidewall of the gate structure. An etching process is performed to form a trench structure in the substrate by using the first mask layer, the second mask layer and the covering structure as an etch mask. The second mask layer is partially removed, and a trench oxide layer is grown on an inner surface of the trench structure. A fourth mask layer is formed within the trench structure and over the first mask layer and the second mask layer. A dry etch-back process is performed to partially remove the fourth mask layer until the level of the fourth mask layer is lower than a surface of the substrate. The covering structure and a portion of the second mask layer are removed. An ion-implanting process is performed to dope the substrate to form a deep doped region at a location adjacent to the trench oxide layer. A metallic sputtering process is performed to form a metallic sputtering layer on the fourth mask layer within the trench structure, the gate structure, the trench oxide layer and the first mask layer. Afterwards, a third photolithography and etching process is performed to partially remove the metallic sputtering layer.

A further embodiment of the present invention provides a method for manufacturing a trench isolation metal-oxide-semiconductor (MOS) P-N junction diode device (i-MOS Rectifier). Firstly, a substrate is provided. A first mask layer is formed on the substrate. A first photolithography and etching process is performed to partially remove the first mask layer to form a concave structure on the substrate. An etching process is performed to partially remove the substrate through the concave structure to form a trench structure in the substrate. A trench oxide layer is formed on an inner surface of the trench structure. A second mask layer is formed over the first mask layer and the trench oxide layer. A dry etch-back process is performed to partially remove the second mask layer until the level of the second mask layer is lower than a surface of the substrate. A second photolithography and etching process is performed to partially remove the first mask layer. A thermal oxidation process is performed to form a first oxide layer on the substrate and the second mask layer. A third mask layer is formed over the first oxide layer, the first mask layer, the second mask layer and the trench oxide layer. A third photolithography and etching process is performed to partially remove the third mask layer to form a gate structure over the first oxide layer and the substrate. An ion-implanting process is performed to dope the substrate to form a deep doped region at a location adjacent to the trench oxide layer. The first oxide layer uncovered by the gate oxide layer is removed. A metallic sputtering process is performed to form a metallic sputtering layer on the third mask layer within the trench structure, the gate structure, the trench oxide layer and the first mask layer. Afterwards, a fourth photolithography and etching process is performed to partially remove the metallic sputtering layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
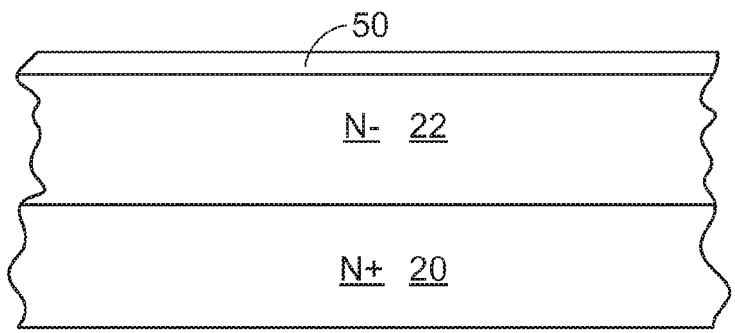
FIGS. 1A~1L (PRIOR ART) schematically illustrate a method of manufacturing a gated diode device according to the prior art.
Figure 1B:
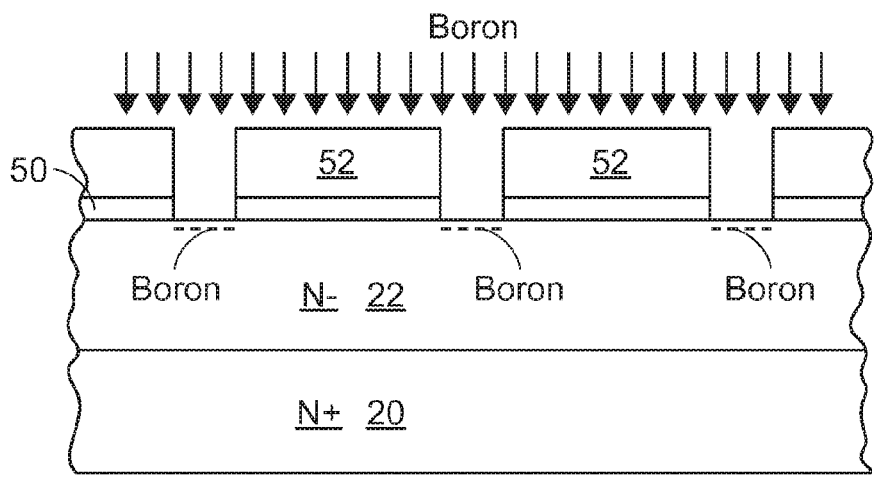
Figure 1C:
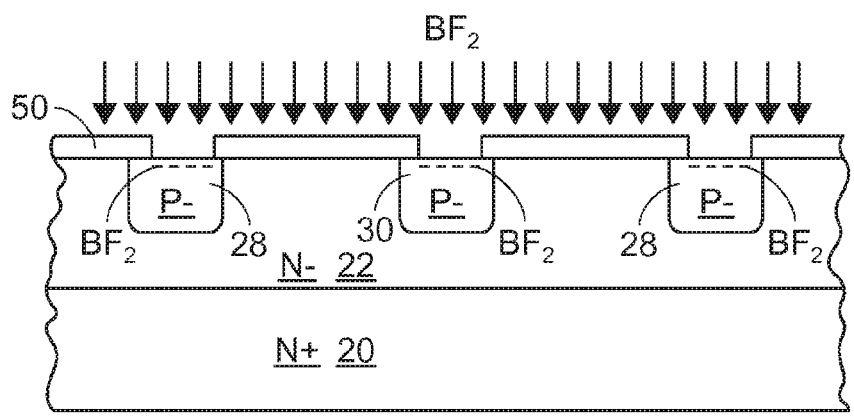
Figure 1D:
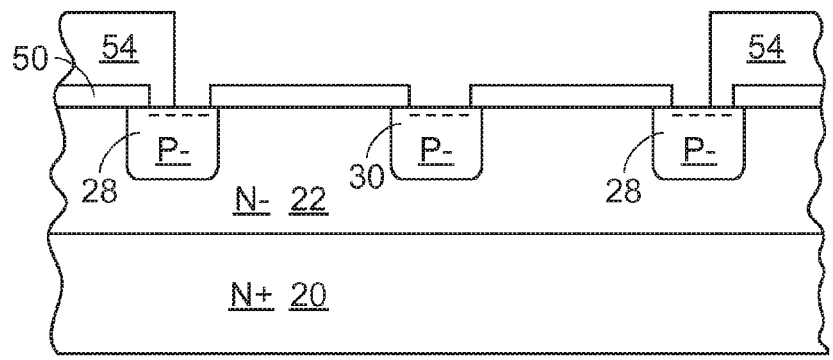
Figure 1E:
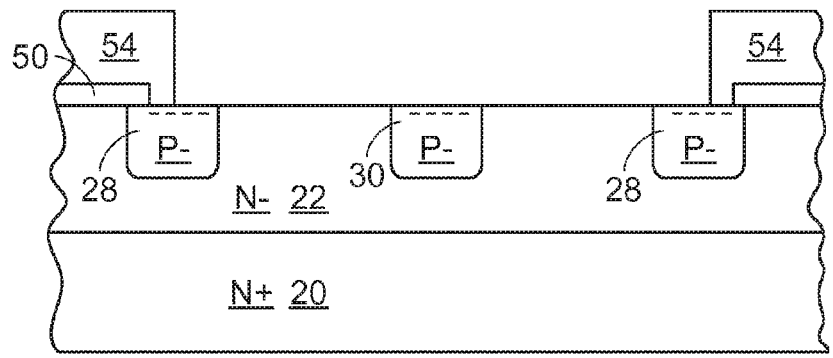
Figure 1F:
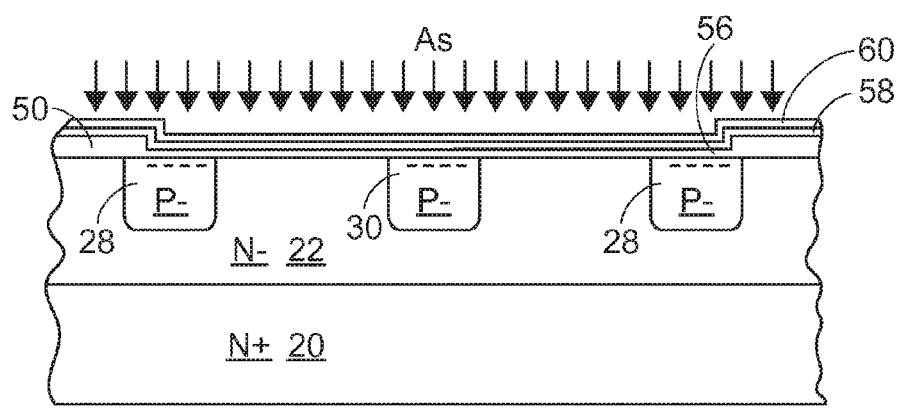
Figure 1G:
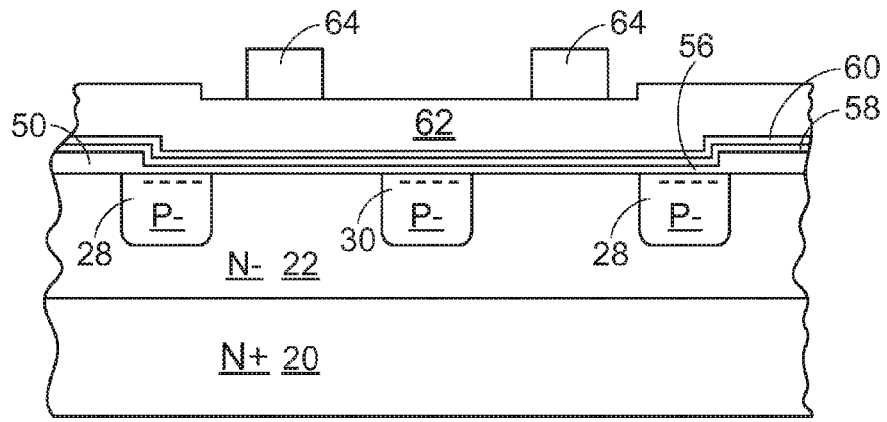
Figure 1H:
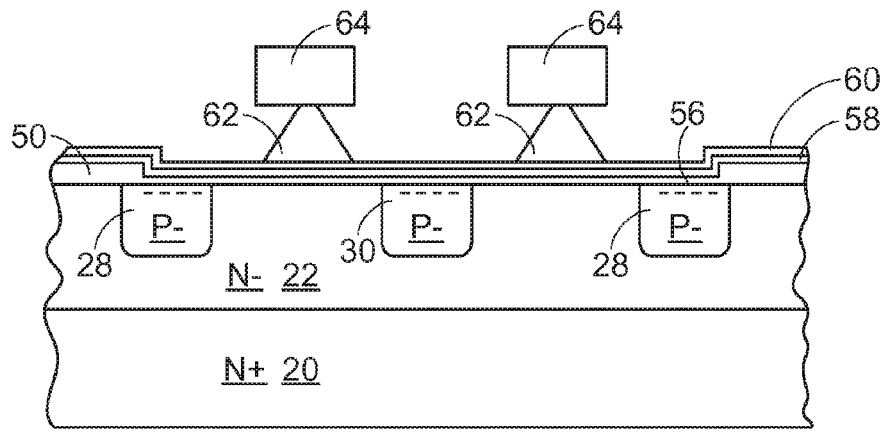
Figure 1I:
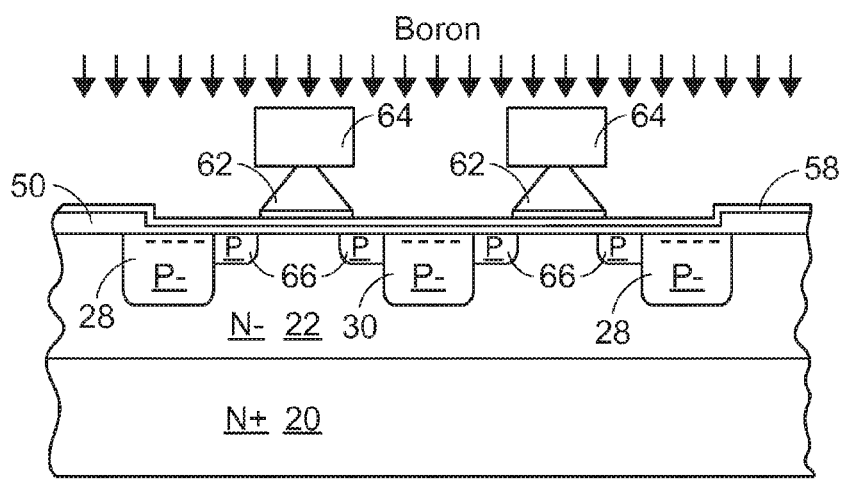
Figure 1J:
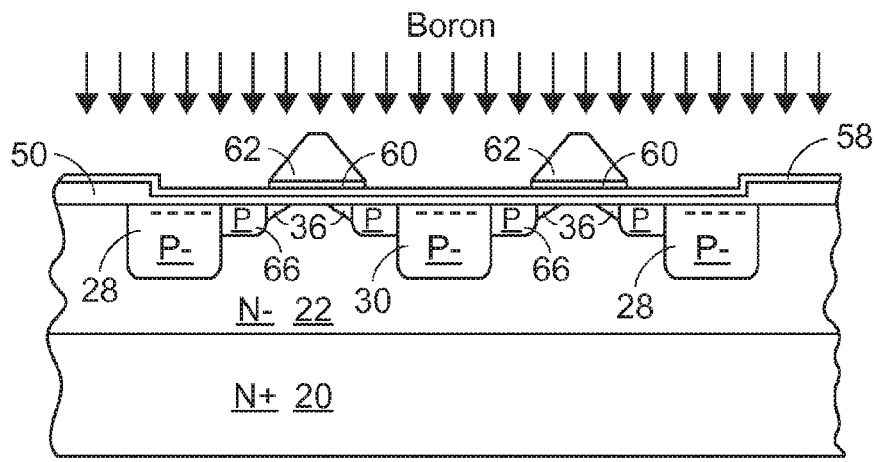
Figure 1K:
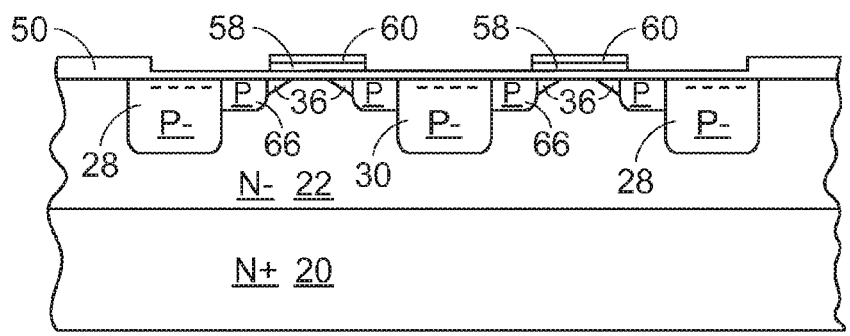
Figure 1L:
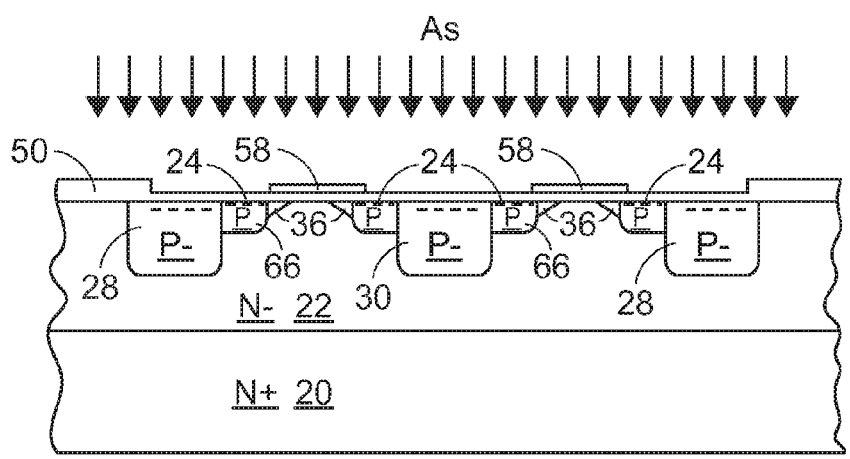
Figure 2A:
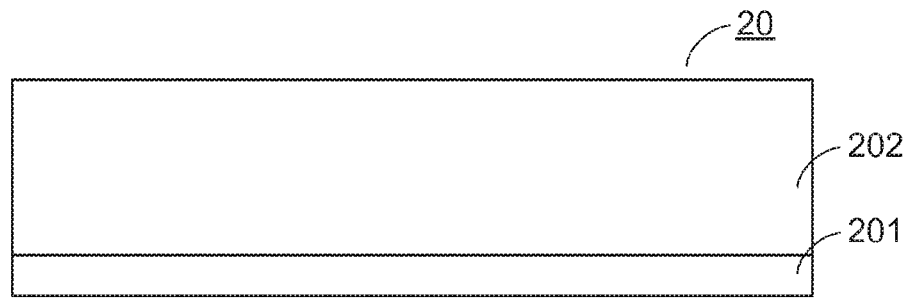
FIGS. 2A~2R schematically illustrate a method of manufacturing a trench isolation metal-oxide-semiconductor (MOS) P-N junction diode device (i-MOS Rectifier) according to a first embodiment of the present invention.
Figure 2B:
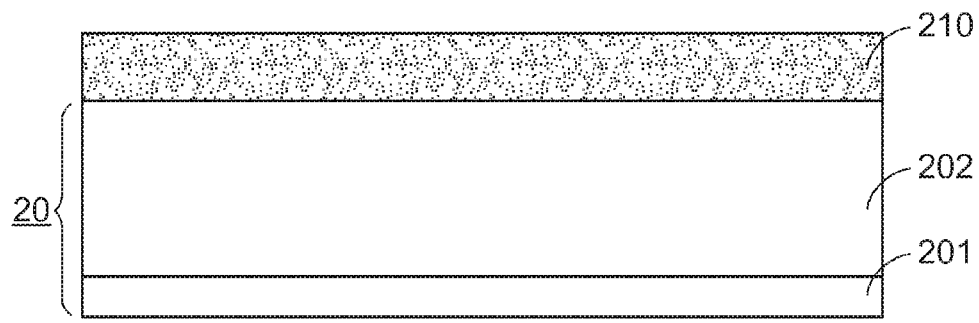
Figure 2C:
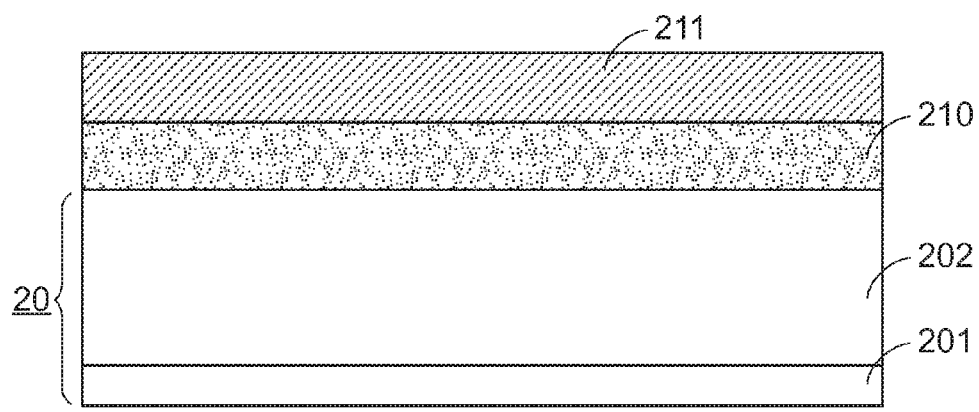
Figure 2D:
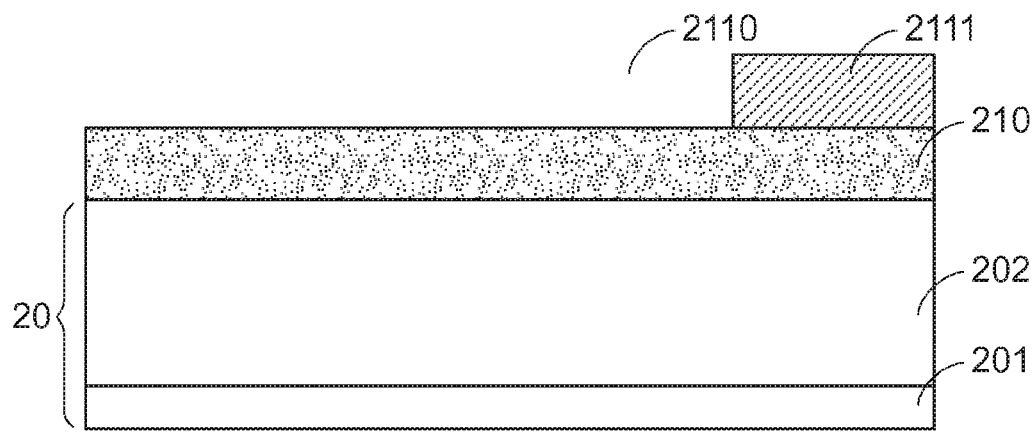
Figure 2E:
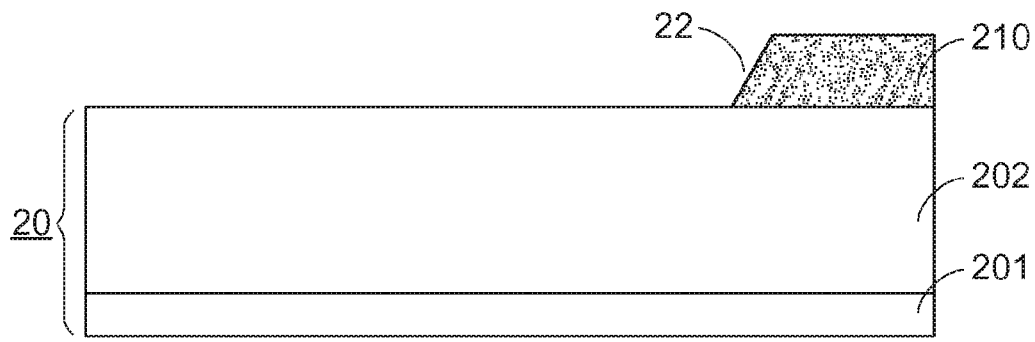
Figure 2F:
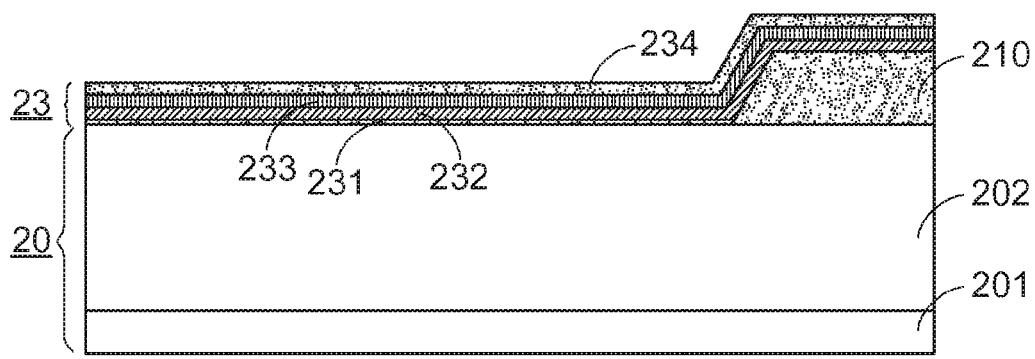
Figure 2G:
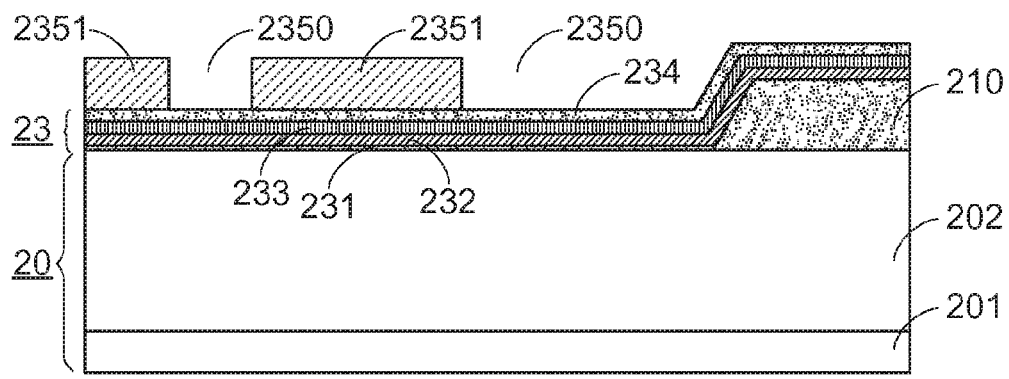
Figure 2H:
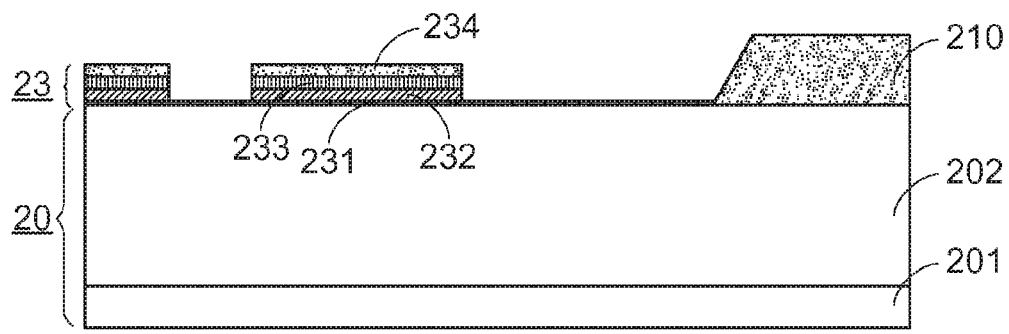
Figure 2I:
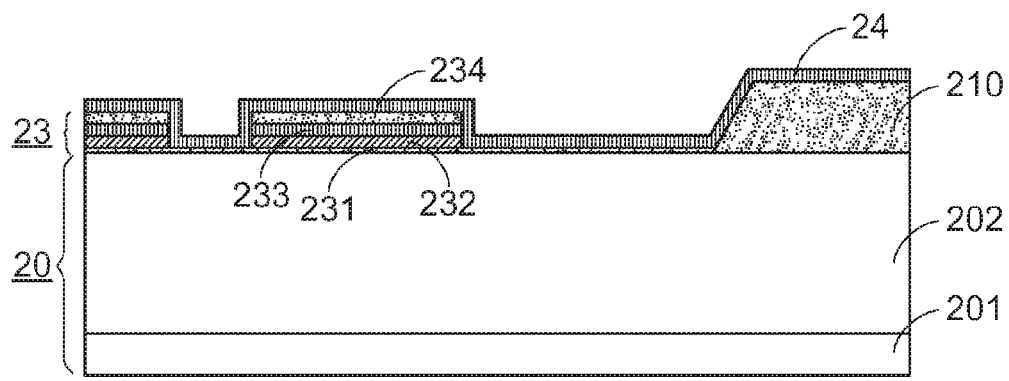
Figure 2J:
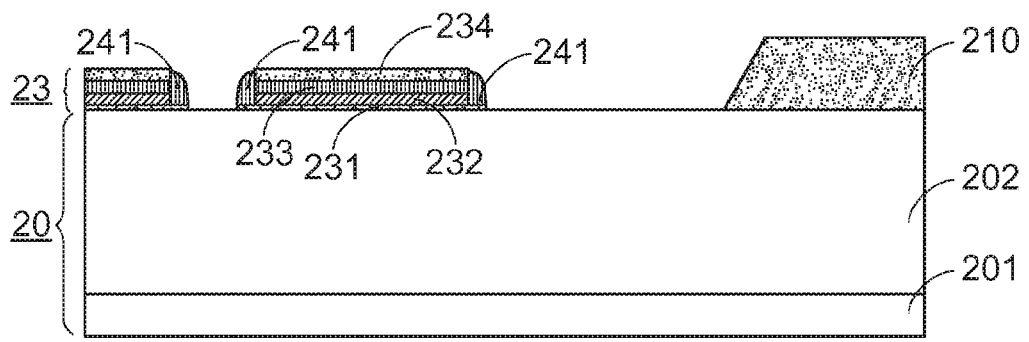
Figure 2K:
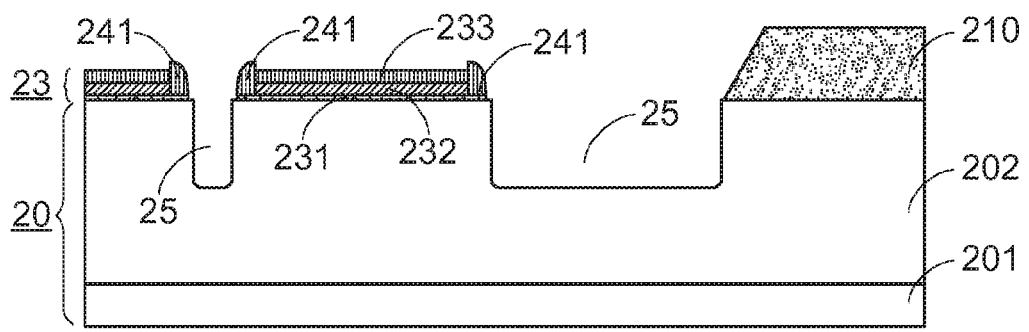
Figure 2L:
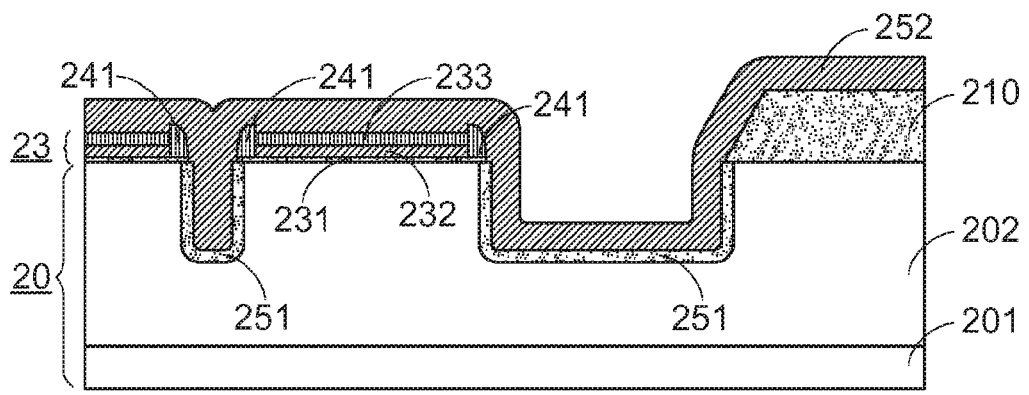
Figure 2M:
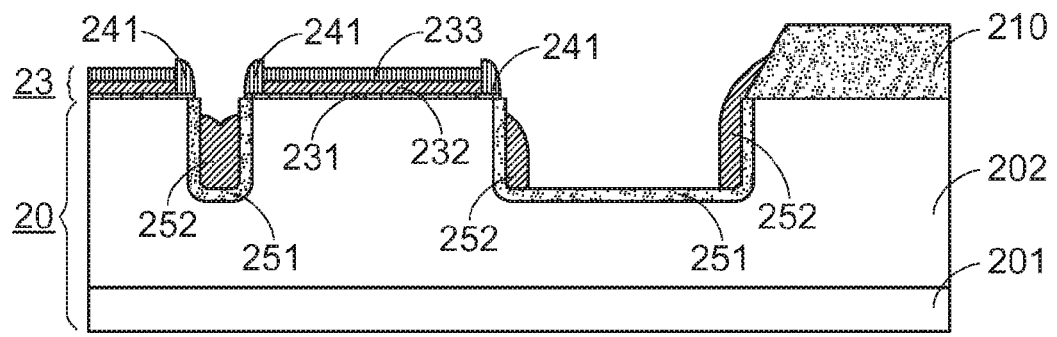
Figure 2N:
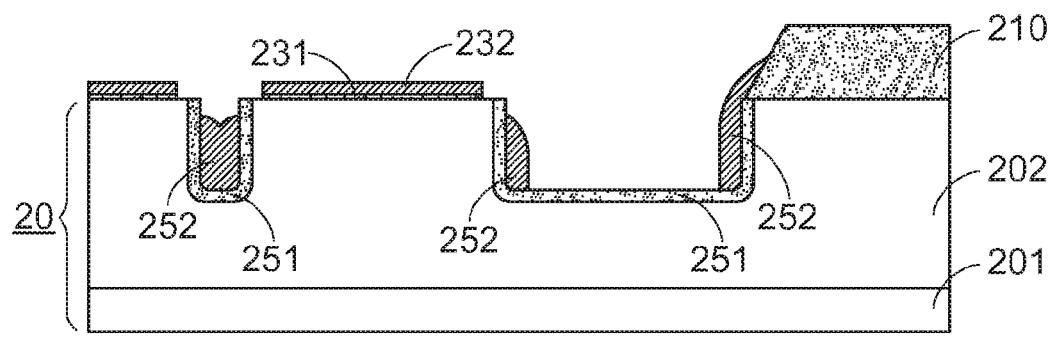
Figure 2O:
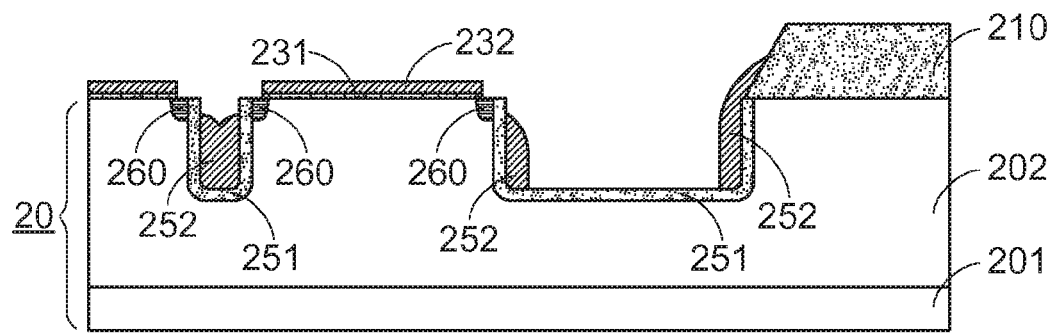
Figure 2P:
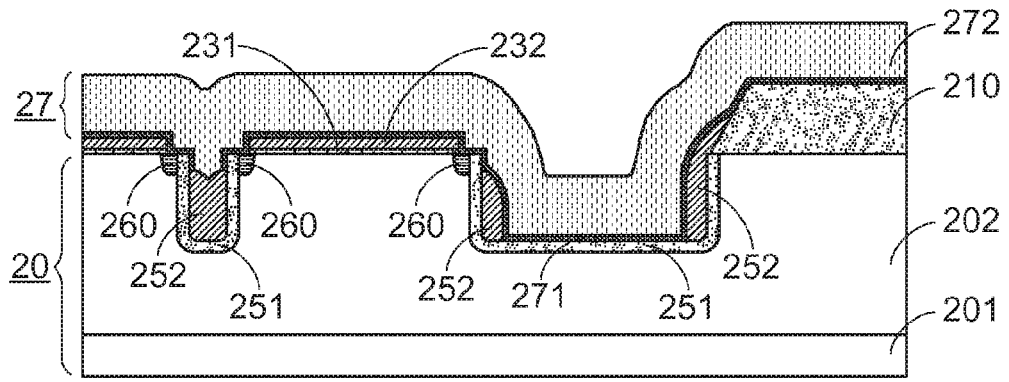
Figure 2Q:
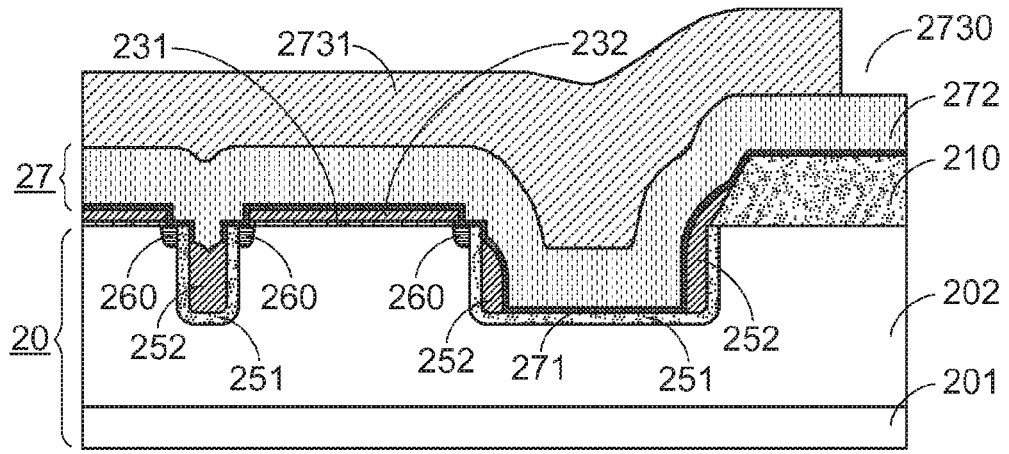
Figure 2R:
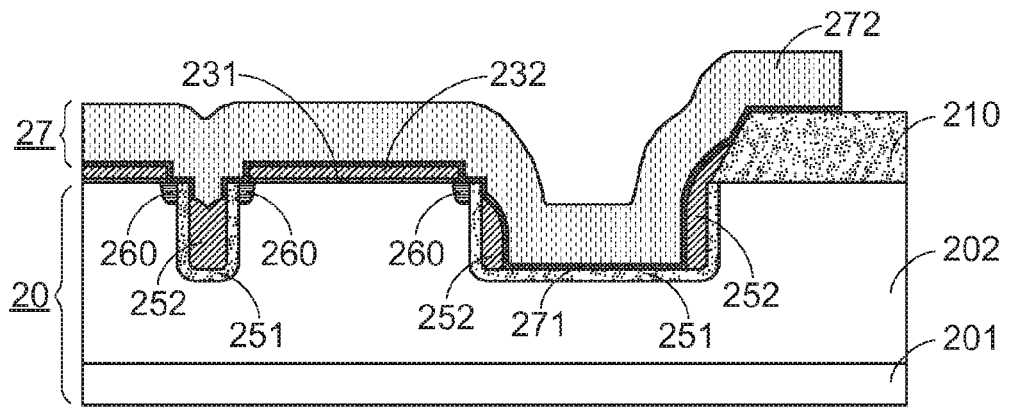

Please refer to FIGS. 2A~2R, which schematically illustrate a method of manufacturing a trench isolation metal-oxide-semiconductor (MOS) P-N junction diode device (i-MOS Rectifier) according to a first embodiment of the present invention.

Firstly, as shown in FIG. 2A, a substrate 20 with a heavily-doped N-type silicon layer 201 (N+ silicon layer) and a lightly-doped N-type epitaxial layer 202 (N− epitaxial layer) is provided. Then, as shown in FIG. 2B, a first mask layer 210 (an oxide layer) is grown on the substrate 20 by thermal oxidation. Then, a photoresist layer 211 is formed on the first mask layer 210 (FIG. 2C). A first photolithography process is performed to define a patterned photoresist zone 2111 and a photoresist-free zone 2110 of the photoresist layer 211 (FIG. 2D). An etching process is performed to remove the first mask layer 210 uncovered by the patterned photoresist zone 2111. After the remaining patterned photoresist zone 2111 is removed, a sidewall structure 22 is formed on the substrate 20

(FIG. 2E). Then, a second mask layer 23 is grown on the substrate 20, the sidewall structure 22 and the first mask layer 210. The second mask layer 23 is formed by growing a gate oxide layer 231 on the substrate 20, and sequentially growing a polysilicon layer 232, a silicon nitride layer 233 and an oxide layer 234 on the substrate 20, the sidewall structure 22 and the first mask layer 210 (see FIG. 2F). A second photolithography process is performed to define a patterned photoresist zone 2351 and a photoresist-free zone 2350 over the second mask layer 23 (FIG. 2G). After an etching process is performed to remove the oxide layer 234, the silicon nitride layer 233 and the polysilicon layer 232 of the second mask layer 23 uncovered by the patterned photoresist zone 2351, the remaining patterned photoresist zone 2351 is removed (FIG. 2H).

Then, as shown in FIG. 2I, a third mask layer 24 (e.g. a silicon nitride layer) is formed over the resulting structure of FIG. 2H. Then, a dry etch-back process is performed to etch the third mask layer 24 to form a covering structure 241 (FIG. 2J). Then, an etching process is performed to form a trench structure 25 in the epitaxial layer 202 of the substrate 20, and the oxide layer 234 is removed (FIG. 2K). Then, as shown in FIG. 2L, a thermal oxide layer 251 (i.e. a trench oxide layer) is grown on the inner surface of the trench structure 25, and then a fourth mask layer 252 (e.g. a polysilicon layer) is formed within the trench structure 25 and on the first mask layer 210 and the second mask layer 23.

Then, a dry etch-back process is performed to partially etch the fourth mask layer 252 until the level of the fourth mask layer 252 is lower than the surface of the substrate 20 by a specified level (FIG. 2M). Then, an etching process is performed to remove the silicon nitride layer 233 and the covering structure 241 (FIG. 2N).

Then, an ion-implanting process is performed to dope the substrate with a boron ion to form a deep doped region 260 in the lightly-doped N-type epitaxial layer 202 and at the location adjacent to the trench oxide layer 251 within the trench structure 25 (FIG. 2O). Then, a metallic sputtering process is performed to form a metallic sputtering layer 27 on the polysilicon layer 252 within the trench structure 25, the polysilicon layer 232 of the gate structure, the exposed oxide layer 251 within the trench structure 25 and the oxide layer 210 (FIG. 2P). In this embodiment, the metallic sputtering layer 27 comprises a first metal layer 271 and a second metal layer 272. The first metal layer 271 is made of titanium or titanium nitride. The second metal layer 272 is made of aluminum or other metallic material. Moreover, after the metallic sputtering layer 27 is formed, a rapid thermal nitridation process is performed to facilitate adhering the first metal layer onto the polysilicon layer 252 within the trench structure 25, the polysilicon layer 232 of the gate structure, the exposed oxide layer 251 within the trench structure 25 and the oxide layer 210.

Then, a photoresist layer is formed on the metallic sputtering layer 27. A third photolithography process is performed to define a patterned photoresist zone 2731 and a photoresist-free zone 2730 of the photoresist layer (FIG. 2Q). An etching process is performed to partially remove the metallic sputtering layer 27 uncovered by the patterned photoresist zone 2731. After the remaining patterned photoresist zone 2731 is removed, the resulting structure of FIG. 2R is produced.

Figure 3A:
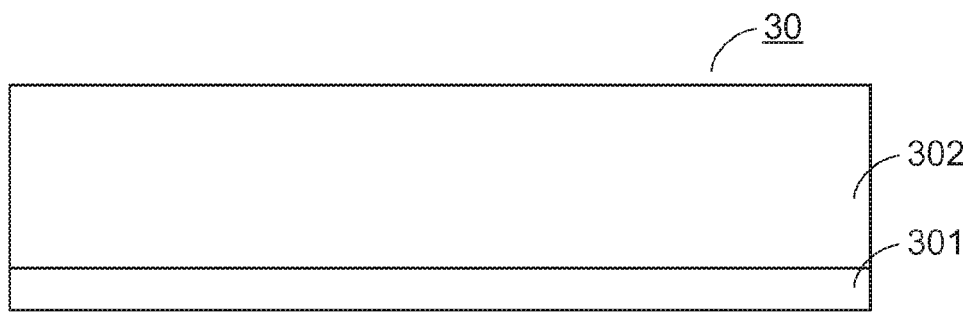
FIGS. 3A~3R schematically illustrate a method of manufacturing a trench isolation metal-oxide-semiconductor (MOS) P-N junction diode device (i-MOS Rectifier) according to a second embodiment of the present invention.
Figure 3B:
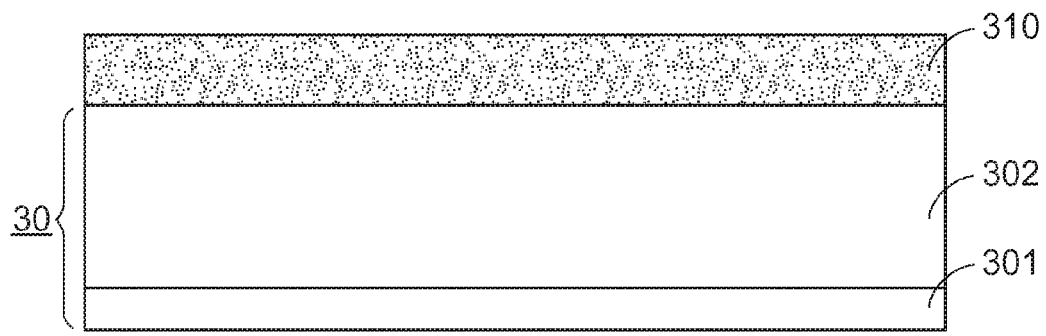
Figure 3C:
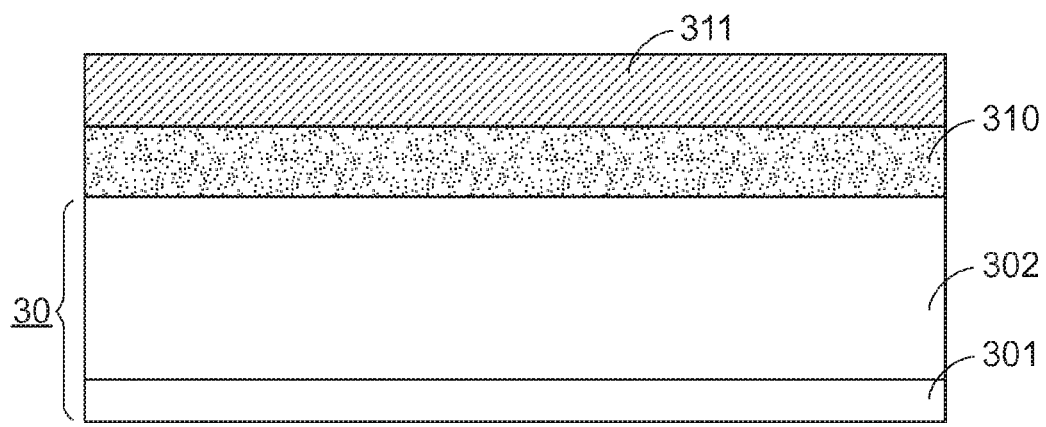
Figure 3D:
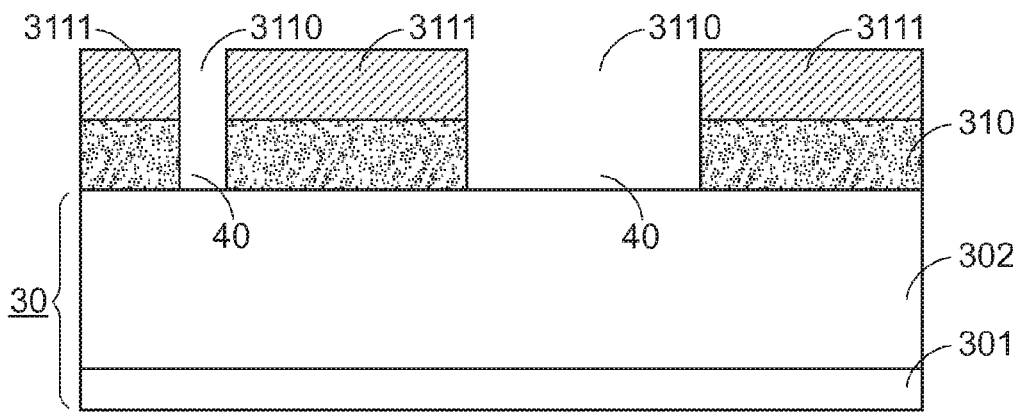
Figure 3E:
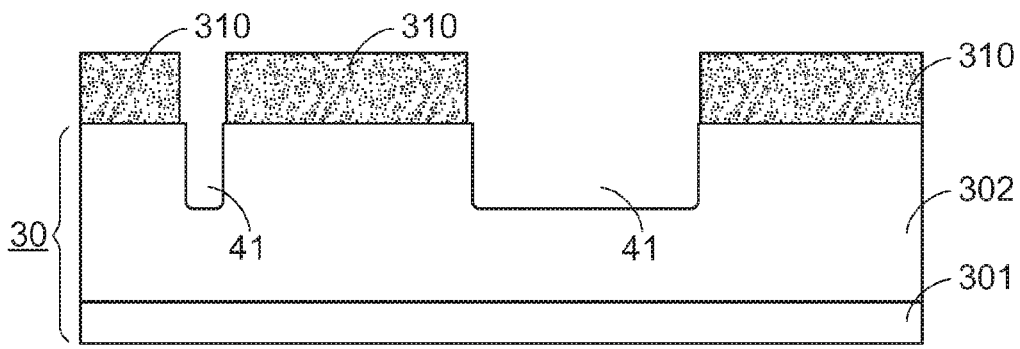
Figure 3F:
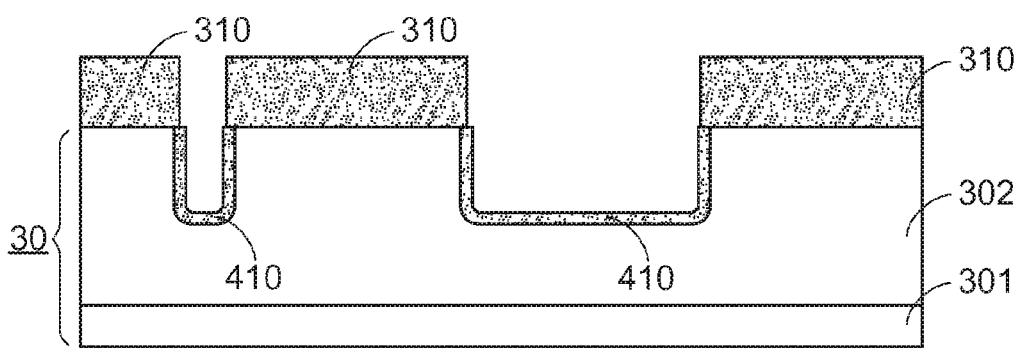
Figure 3G:
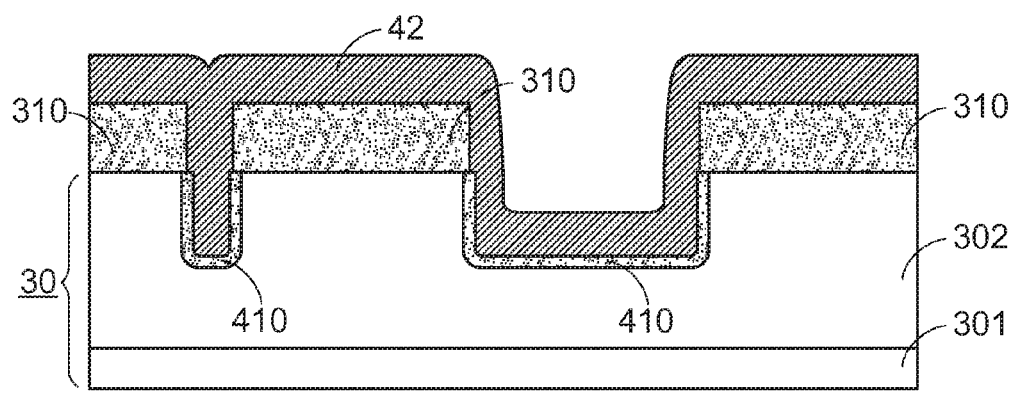
Figure 3H:
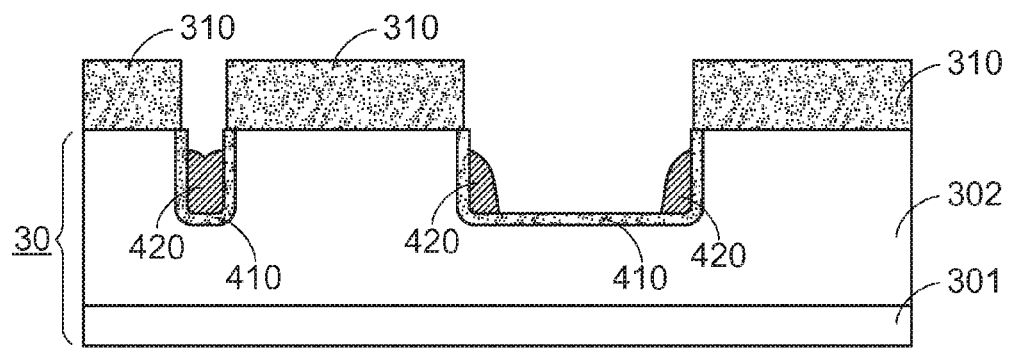
Figure 3I:
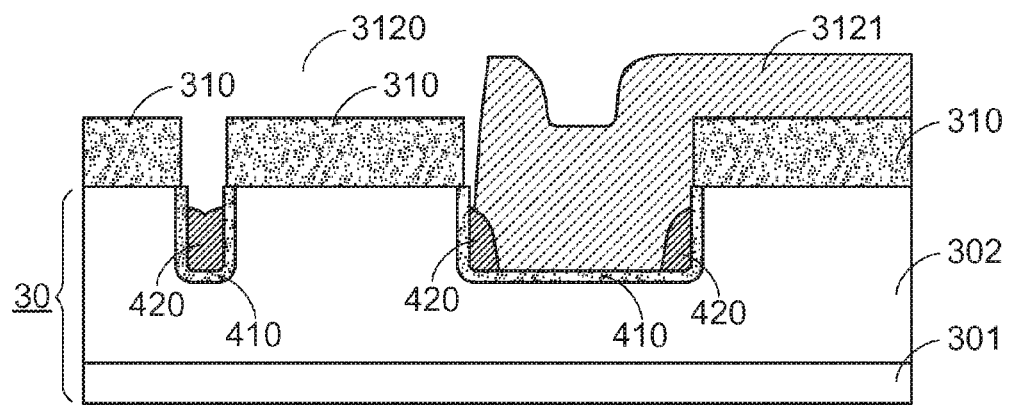
Figure 3J:
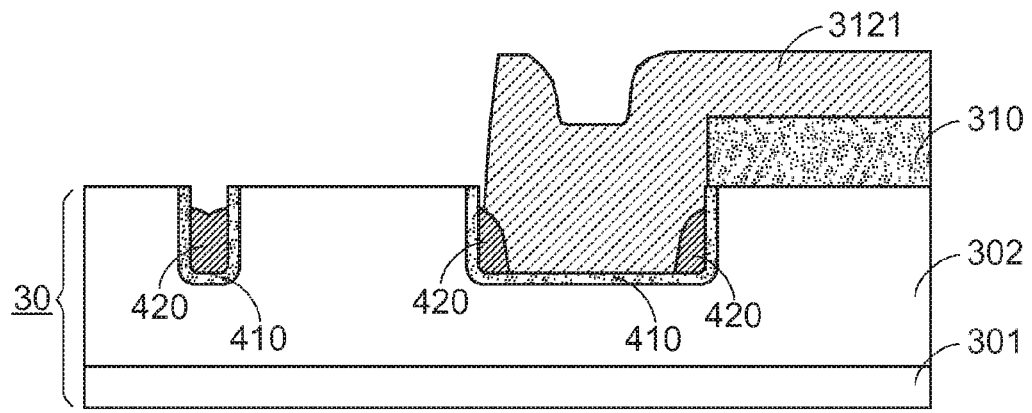
Figure 3K:
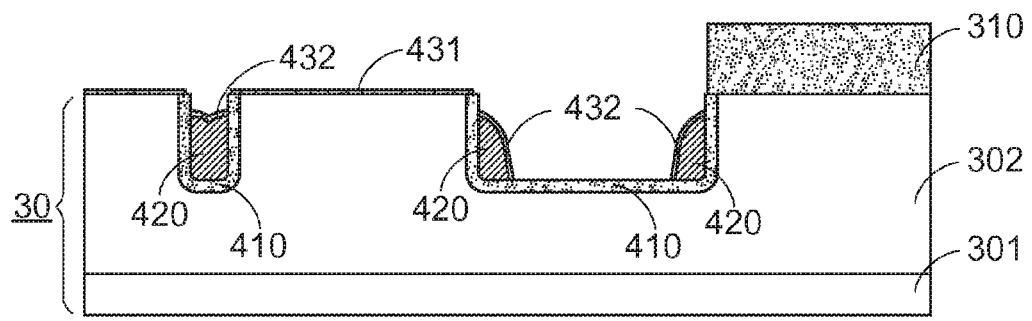
Figure 3L:
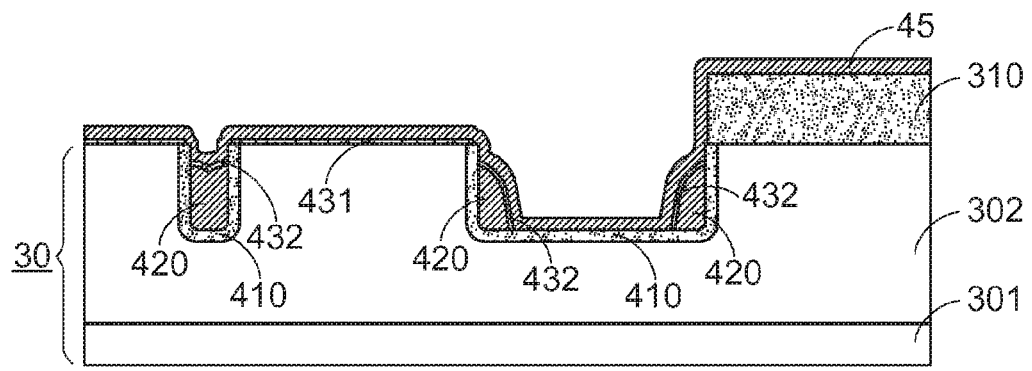
Figure 3M:
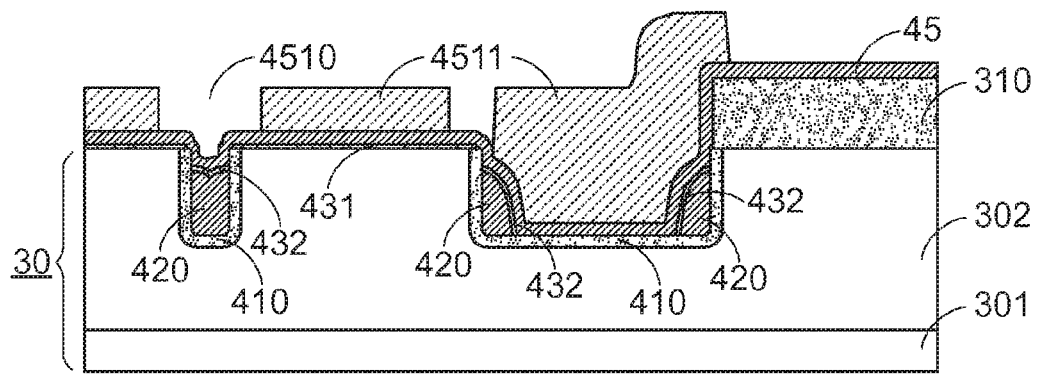
Figure 3N:
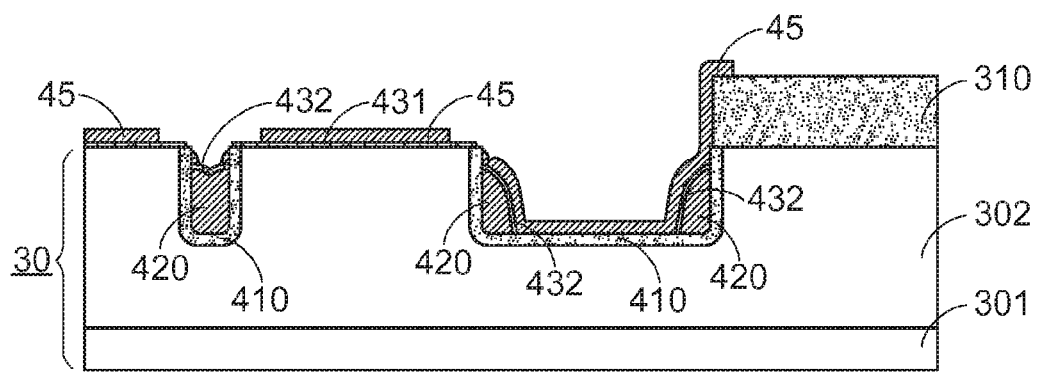
Figure 3O:
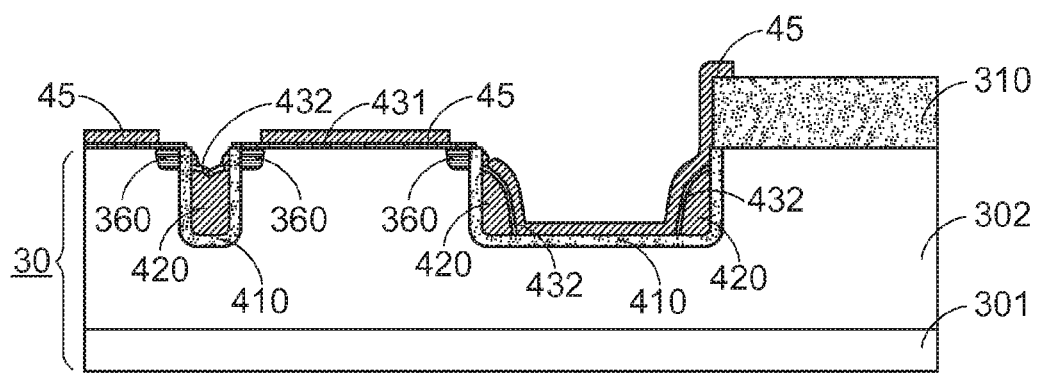
Figure 3P:
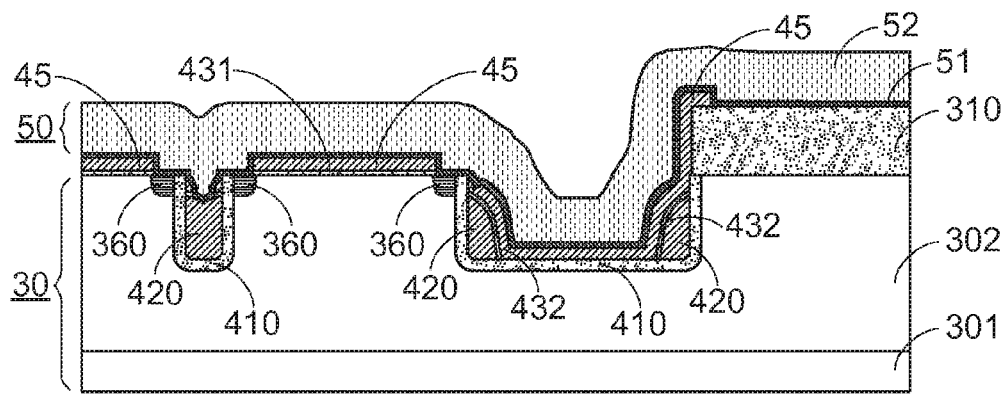
Figure 3Q:
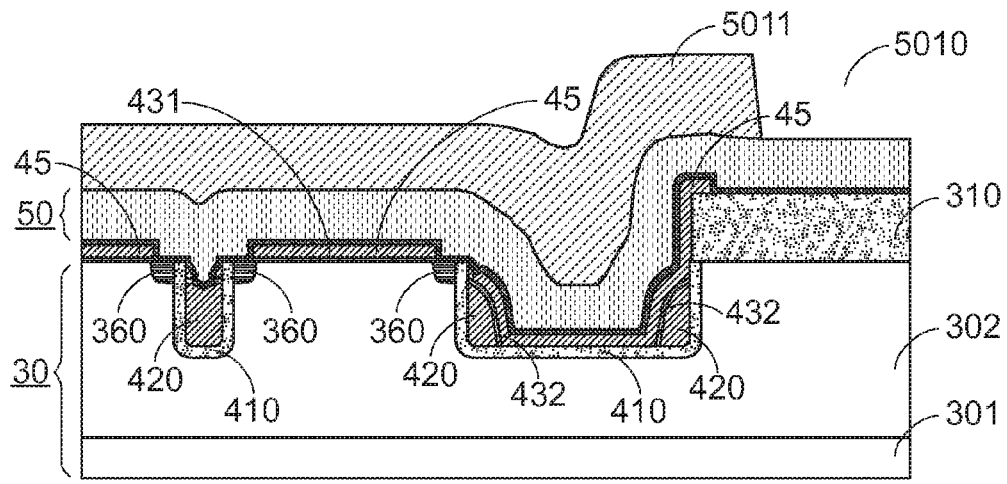
Figure 3R:
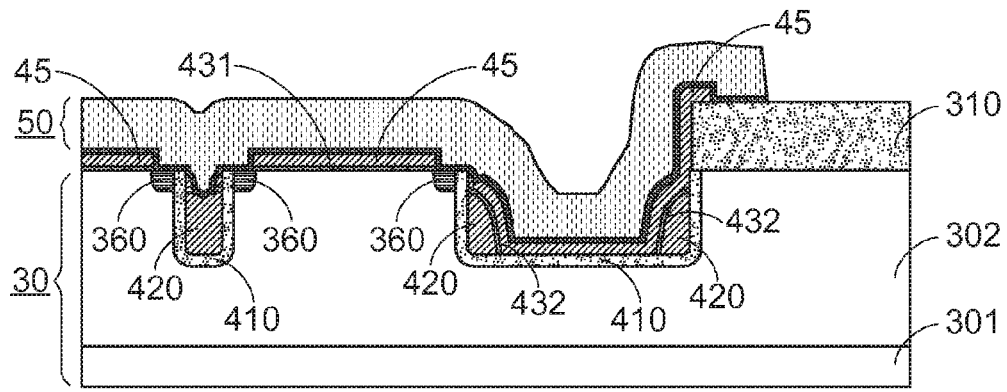

Please refer to FIGS. 3A-3R, which schematically illustrate a method of manufacturing a trench isolation metal-oxide-semiconductor (MOS) P-N junction diode device (i-MOS Rectifier) according to a second embodiment of the present invention.

Firstly, as shown in FIG. 3A, a substrate 30 with a heavily-doped N-type silicon layer 301 (N+ silicon layer) and a lightly-doped N-type epitaxial layer (N− epitaxial layer) 302 is provided. Then, as shown in FIG. 3B, a first mask layer 310 (an oxide layer) is grown on the substrate 30 by thermal oxidation. Then, a photoresist layer 311 is formed on the first mask layer 310 (FIG. 3C). Then, a first photolithography process is performed to define a patterned photoresist zone 3111 and a photoresist-free zone 3110 of the photoresist layer 311 (FIG. 3D). A dry etching process is performed to remove the first mask layer 310 uncovered by the patterned photoresist zone 3111 to form a concave structure 40 in the first mask layer 310. Then, the remaining patterned photoresist zone 3111 is removed, and an etching process is performed to partially remove the substrate uncovered by the first mask layer 310 to form a trench structure 41 in the substrate 302 (FIG. 3E).

Then, as shown in FIG. 3F, a first oxide layer 410 is grown on the inner surface of the trench structure 41. Then, a second mask layer 42 e.g. a polysilicon layer) is formed on the first mask layer 310 and the first oxide layer 410 (FIG. 3G). Then, a dry etch-back process is performed to etch the second mask layer 42 until the surface of the remain polysilicon layer 420 within the trench structure 41 is lower than the surface of the N-type epitaxial layer 302 by about 3000 angstroms (FIG. 3H).

Then, a second photolithography process is performed to define a patterned photoresist zone 3121 and a photoresist-free zone 3120 on the substrate 30 (FIG. 3I). By using the patterned photoresist zone 3121 as an etch mask, an etching process is performed to remove the first mask layer 310 uncovered by the patterned photoresist zone 3121 (FIG. 3J). After the remaining patterned photoresist zone 3121 is removed, the substrate 30 is cleaned. Then, by thermal oxidation, a gate oxide layer 431 is formed on the substrate 30 and an oxide layer 432 is formed on the surface of the polysilicon layer 420 (FIG. 3K). Then, as shown in FIG. 3L, a third mask layer 45 (e.g. a polysilicon layer) is formed over the gate oxide layer 431, the oxide layer 432 overlying the polysilicon layer 420, the exposed trench oxide layer 410 and the first mask layer 310.

Then, a third photolithography process is performed to define a patterned photoresist zone 4511 and a photoresist-free zone 4510 on the substrate 30 (FIG. 3M). Then, an etching process is performed to remove the third mask layer 45 uncovered by the patterned photoresist zone 4511 by using the patterned photoresist zone 4511 as an etch mask (FIG. 3N). After the remaining patterned photoresist zone 4511 is removed, an ion-implanting process is performed to dope the substrate with a boron ion and a rapid thermal annealing process is performed. Consequently, a deep doped region 360 is formed in the lightly-doped N-type epitaxial layer 302 and at the location adjacent to the trench oxide layer 410 (FIG. 3O).

Then, the substrate is cleaned, and an etching process is performed to partially remove the gate oxide layer 431 overlying the deep doped region 360 and the oxide layer 432 overlying the polysilicon layer 420. Then, a metallic sputtering process is performed to form a metallic sputtering layer 50 on the exposed oxide layer 410 within the trench structure 41, the polysilicon layer 420 within the trench structure 41, the polysilicon layer 45 of the gate structure and the oxide layer 310 (FIG. 3P). In this embodiment, the metallic sputtering layer 50 comprises a first metal layer 51 and a second metal layer 52. The first metal layer 51 is made of titanium or titanium nitride. The second metal layer 52 is made of aluminum or other metallic material. Moreover, after the metallic sputtering layer 50 is formed, a rapid thermal nitridation process is performed to facilitate adhering the first metal layer onto the exposed oxide layer 410 within the trench structure 41, the polysilicon layer 420 within the trench structure 41, the polysilicon layer 45 of the gate structure and the oxide layer 310.

Then, a photoresist layer is formed on the metallic sputtering layer 50. A fourth photolithography process is performed to define a patterned photoresist zone 5011 and a photoresist-free zone 5010 of the photoresist layer (FIG. 3Q). An etching process is performed to partially remove the metallic sputtering layer 50 uncovered by the patterned photoresist zone 5011. After the remaining patterned photoresist zone 5011 is removed, the resulting structure of FIG. 3R is produced.

Form the above description, the present invention provides a trench isolation metal-oxide-semiconductor (MOS) P-N junction diode device (i-MOS Rectifier) and a manufacturing method thereof. The trench isolation MOS P-N junction diode device is a combination of an N-channel MOS structure and a lateral P-N junction diode, wherein a polysilicon-filled trench oxide layer is buried in the P-type structure to replace the majority of the P-type structure. In a forward mode, the N-channel MOS structure and the P-N junction diode are connected with each other in parallel. Under this circumstance, like the Schottky diode, the trench isolation MOS P-N junction diode device has low forward voltage drop and rapid switching speed. Whereas, in a reverse mode, the leakage current is pinched off and the N-channel is shut off by the polysilicon-filled trench oxide layer and the depletion region of the lateral P-N junction diode, so that the trench isolation MOS P-N junction diode device (i-MOS Rectifier) has low leakage current. In addition, since the polysilicon-filled trench oxide layer is buried in the P-type structure to replace the majority of the P-type structure, the area of the P-type structure is reduced and the influence of the carrier effect is reduced. Under this circumstance, the trench isolation MOS P-N junction diode device has shorter reverse recovery time. As a consequence, the trench isolation MOS P-N junction diode device (i-MOS Rectifier) of the present invention has the benefits of the Schottky diode and the P-N junction diode. That is, the trench isolation MOS P-N junction diode device of the present invention has rapid switching speed, low forward voltage drop, low reverse leakage current and short reverse recovery time.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A trench isolation metal-oxide-semiconductor (MOS) P-N junction diode device (i-MOS Rectifier), comprising:
    a substrate;
    a first trench structure formed in the substrate;
    a second trench structure formed in the substrate, wherein the first trench structure and the second trench structure is capable of dividing the substrate into a plurality of surface portions and a first surface portion is located between the first trench structure and the second trench structure;
    a trench oxide layer formed on an inner surface of the first trench structure;
    a polysilicon layer filled in the first trench structure and formed on the trench oxide layer, but at a level lower than a surface of the substrate;
    a gate oxide layer formed on the first surface portion of the substrate;
    a gate structure formed on the gate oxide layer;
    a doped region formed under the first surface portion and outside the gate oxide layer and contacted to the trench oxide layer; and
    a metallic sputtering layer contacted to the gate structure, the polysilicon layer in the first trench structure and the doped region.

2. The trench isolation MOS P-N junction diode device as claimed in claim 1, wherein the metallic sputtering layer comprises a first metal layer and a second metal layer stacked on the first metal layer, wherein the first metal layer is made of titanium or titanium nitride.

3. The trench isolation MOS P-N junction diode device as claimed in claim 1, wherein the doped region is formed by doping the substrate with boron ion.

* * * * *